United States Patent [19]

Townsend

[11] 4,038,953

[45] Aug. 2, 1977

[54] ROTARY INTERNAL COMBUSTION ENGINE HAVING ROTARY VALVE MEANS FOR FUEL AND AIR INTRODUCTION

[75] Inventor: Ray T. Townsend, Des Moines, Iowa

[73] Assignee: Townsend Engineering Company, Des Moines, Iowa

[21] Appl. No.: 494,409

[22] Filed: Aug. 5, 1974

Related U.S. Application Data

[63] Continuation-in-part of Ser. No. 286,189, Sept. 5, 1972, abandoned, and Ser. No. 301,096, Oct. 26, 1972, Pat. No. 3,857,372, Continuation-in-part of Ser. No. 286,189, Sept. 5, 1972, abandoned, and Ser. No. 378,701, July 12, 1973, Pat. No. 3,874,348.

[51] Int. Cl.² .................... F02B 57/00; F02M 59/12
[52] U.S. Cl. .................... 123/44 E; 123/138; 123/37
[58] Field of Search ............. 123/37, 44 E, 44 B, 123/8.11, 44 C, 138, 43 C, 44 D, 143 A, 32 B, 32 E; 137/625.47

[56] References Cited

U.S. PATENT DOCUMENTS

| 1,229,643 | 6/1917 | Myers | 123/44 D |
|---|---|---|---|
| 1,515,562 | 11/1924 | Enssle | 123/143 A |
| 1,633,385 | 6/1927 | Moore | 123/37 |
| 1,990,660 | 2/1935 | McCann | 123/44 E |
| 2,206,571 | 7/1940 | Kinslow | 123/65 R |
| 2,222,440 | 11/1940 | Nawman | 123/143 A |
| 2,905,159 | 9/1959 | Larson | 123/37 X |

*Primary Examiner*—Carlton R. Croyle
*Assistant Examiner*—Thomas I. Ross

*Attorney, Agent, or Firm*—Zarley, McKee, Thomte & Voorhees

[57] ABSTRACT

A rotary internal combustion engine comprising an engine frame having a rotor rotatably mounted therein which has a plurality of radially spaced cylinders mounted thereon. The free floating piston is slidably mounted in each of the cylinders with the head of the piston being positioned towards the center of the rotor with a roller mounted in the skirt end thereof which rides against a circular cam. A drive shaft is secured to the rotor and it rotatably extends outwardly from one side of the engine frame. A core means extends into the engine frame opposite of the drive shaft and has air and fuel passageways formed therein which are in communication with a source of air and fuel respectively. The inner end of the core means communicates with a rotary valve which is in communication with air and fuel passageways formed in the rotor which are in communication with the cylinders. Each of the cylinders is provided with a plurality of radially spaced openings formed therein. A portion of the cylinder openings are in communication with the air passageway formed in the rotary valve while a portion of the cylinder openings are in communication with the fuel passageway formed in the rotary valve means. The remaining cylinder openings are in communication with an exhaust manifold so that the exhaust gases may be expelled from the interior of the cylinder outwardly through the center of the drive shaft. Each of the cylinders is provided with a plurality of small combustion reservoir cavities formed therein near the top portion thereof which permits more efficient and accurate timing.

5 Claims, 10 Drawing Figures

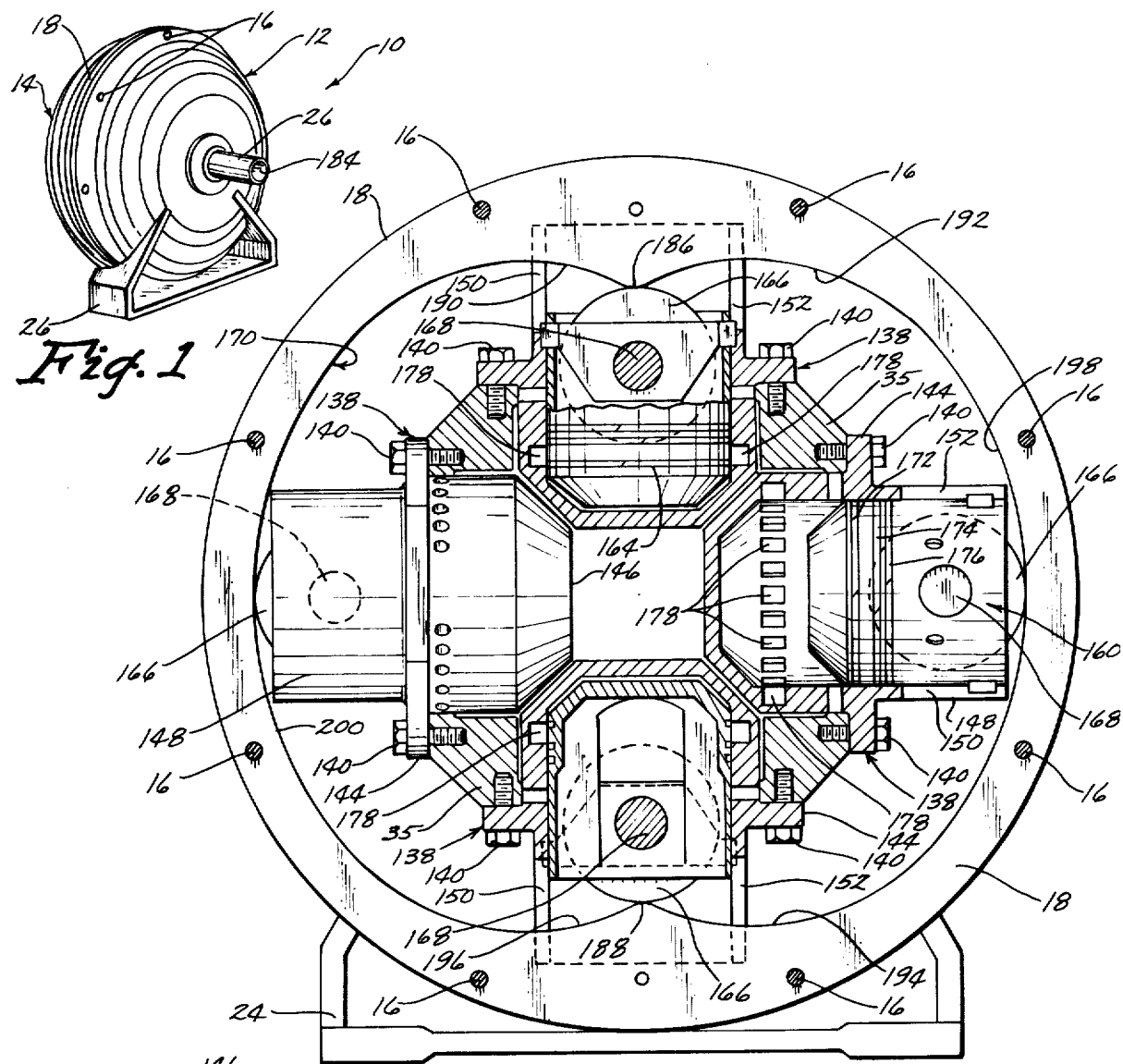
Fig. 1
Fig. 2
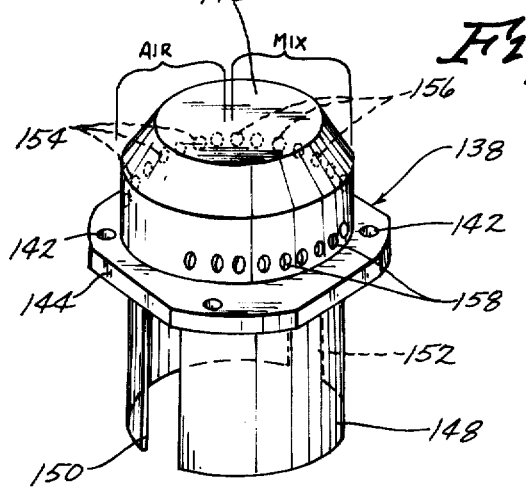
Fig. 3
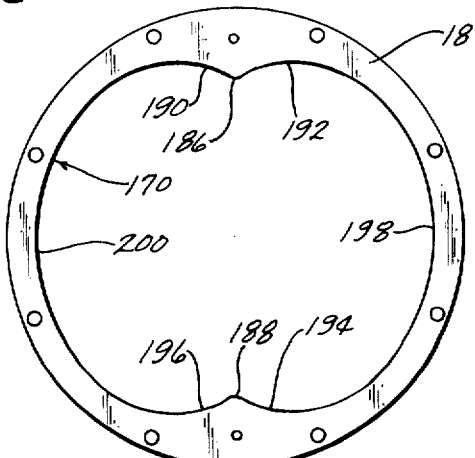
Fig. 4

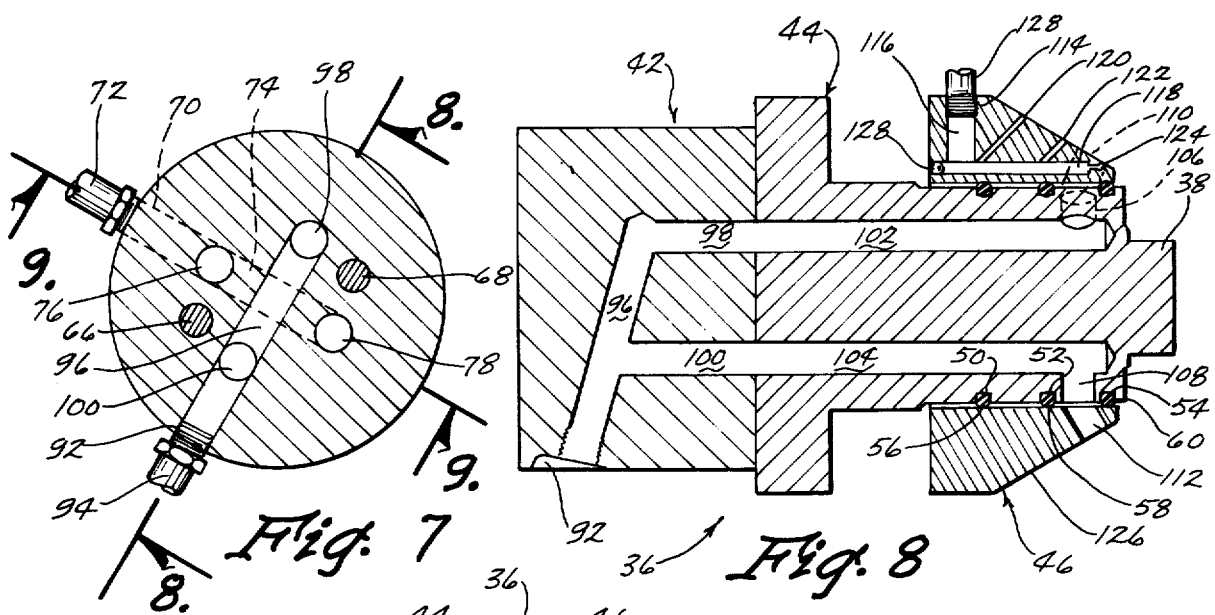
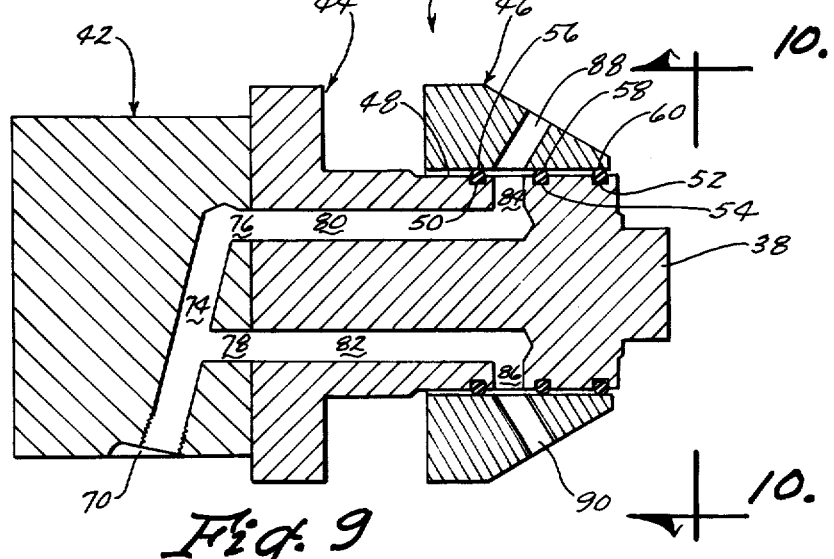
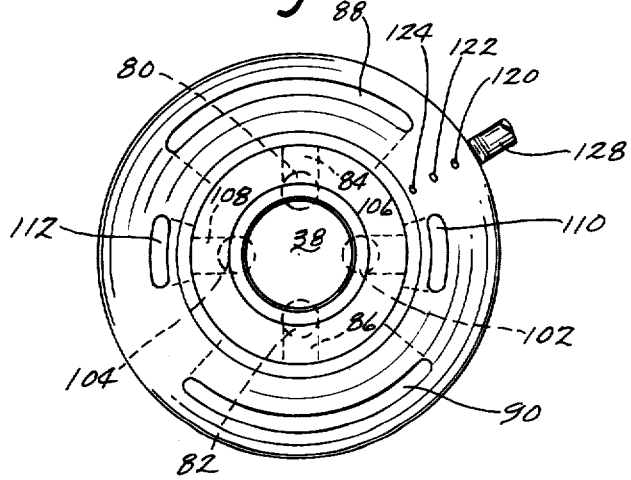

ROTARY INTERNAL COMBUSTION ENGINE HAVING ROTARY VALVE MEANS FOR FUEL AND AIR INTRODUCTION

BACKGROUND OF THE INVENTION

This application is a continuation-in-part application of applications Ser. No. 286,189 filed Sept. 5, 1972 now abandoned in favor of Ser. No. 301,096 filed Oct. 26, 1972, now U.S. Pat. No. 3,857,372; and Ser. No. 378,701 filed July 12, 1973, now U.S. Pat. No. 3,874,348.

In the usual internal combustion engines, the heat generated by the explosion is partly dissipated or conducted into the walls of the surrounding metals, and as it is conducted through the walls, it is radiated off to the air from fins on the outer surface of the cylinders, or is conducted into a liquid coolant in a jacket around the cylinders.

In rotary internal combustion engines of the cam type, the rollers of the pistons are forced outwardly into engagement with the cam plates so that the rollers will follow the shape of the cam plate. Frequently, the centrifugal force is not enough to overcome the vacuum effect when the pistons are required to suck in their charge of air in conventional fashion.

In a conventional engine of either the compression or spark ignition type, there is a problem of detonation and/or pre-ignition caused by the sudden pressure and temperature rise immediately after ignition while the crank is still near the top center where there is very little volume into which the gas can expand. To cope with this problem, a combustion deterrent such as lead has been used to slow the burning of the fuel, or the fuel has been slowly injected into the cylinder as in diesel engines so that the combustion will take place slowly as the piston expands down into the cylinder. This solution requires very careful timing and control and it is inefficient since some of the burning is retarded until the piston has been considerably moved towards an expanded position.

Conventional rotary internal combustion engines have experienced some problems in the manner of sealing the respective cylinders, air ports, gas ports, etc. Elaborate sealing mechanisms have been attempted but the problem is largely unsolved. A further problem existing in present rotary internal combustion engines is in supplying air and fuel to the respective cylinders at the proper time in an efficient manner.

The rotary internal combustion engines disclosed in the co-pending applications represented significant improvements over those prior art engines discussed above. The instant invention provides an engine wherein the sealing of the combustion chamber is improved and wherein an improved means is provided for timing the engine. The instant invention also exhibits overall increased efficiency and performance.

Therefore, a principal object of the invention is to provide an improved rotary internal combustion engine.

A further object of the invention is to provide a rotary internal combustion engine in which the exhaust is passed out of the individual cylinders instead of through a common valve port.

A further object of the invention is to provide a means for preventing excessive pressure and temperature from occurring in the cylinders during combustion.

A further object of the invention is to provide a rotary internal combustion engine wherein the exhaust gases are passed outwardly through the center of the power or drive shaft.

A further object of the invention is to provide a rotary internal combustion engine including a rotary valve means for supplying air and fuel to the interiors of the cylinders at the proper times.

A further object of the invention is to provide a rotary internal combustion engine including means for supplying air thereto for purging, cooling, and recharging the cylinders.

A further object of the invention is to provide a rotary internal combustion engine having improved efficiency and which is economical to manufacture and durable in use.

These and other objects will be apparent to those skilled in the art.

SUMMARY OF THE INVENTION

In the instant invention, a stationary core extends inwardly into one side of the engine frame while the drive shaft extends rotatably outwardly through the other side of the engine frame. A rotor is rotatably mounted within the engine frame and is operatively connected to the drive shaft. A plurality of spaced apart cylinders are mounted on the rotor with a piston being movably mounted in each of the cylinders. A cam plate is provided on the frame and has a cam surface thereon which is engaged by the rollers secured to each of the pistons so that the pistons will be moved between positions of compression and expansion as the rotor is being rotated with respect to the engine frame and with respect to the core.

A rotary valve means is rotatably mounted on the inner end of the core for supplying air and fuel from the core to the interiors of the cylinders at predetermined times. A plurality of combustion reservoir cavities are provided in the interior wall of each of the cylinders for controlling the timing of the ignition.

BRIEF DESCRIPTION OF THE DRAWINGS

This invention consists in the construction, arrangements and combination of the various parts of the device, whereby the objects contemplated are attained as hereinafter more fully set forth, specifically pointed out in the claims, and illustrated in the accompanying drawings, in which:

FIG. 1 is a perspective view of the engine of this invention:

FIG. 2 is a sectional view of the engine with portions thereof cut-away to more fully illustrate the invention:

FIG. 3 is a perspective view of one of the cylinders of the engine:

FIG. 4 is a plan view of the cam plate:

FIG. 7 is an enlarged sectional view seen on lines 7—7 of FIG. 6:

FIG. 8 is an enlarged sectional view seen on lines 8—8 of FIG. 7:

FIG. 9 is an enlarged sectional view seen on lines 9—9 of FIG. 7; and

FIG. 10 is an end view of the core as seen on lines 10—10 of FIG. 9.

DESCRIPTION OF THE PREFERRED EMBODIMENT

Figure 5:
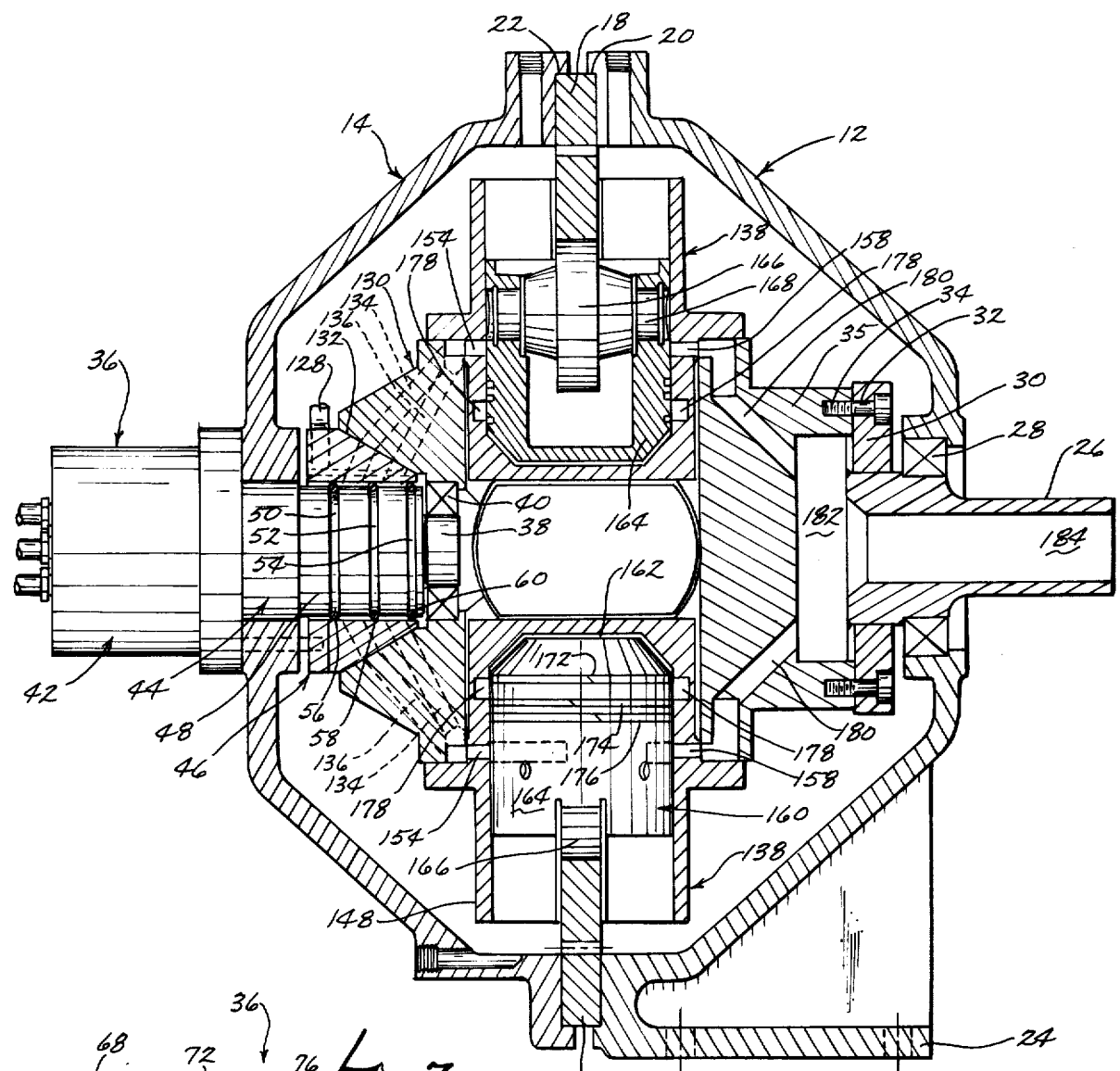
FIG. 5 is a sectional view of the engine taken at right angles to the sectional view of FIG. 2.

The engine of this invention is referred to generally by the reference numeral 10 and generally comprises engine frames 12 and 14 secured together by bolts 16 or other suitable means as seen in FIGS. 1 and 2. As shown in FIG. 1, a circular cam plate 18 is positioned between the frames 12 and 14 with the bolt 16 extending therethrough. The cam plate 18 is positioned with respect to the peripheral edges of frames 12 and 14 by the annular recesses 20 and 22 formed therein respectively (FIG. 5). Frame 12 includes a bracket portion 24 extending therefrom for mounting the engine.

Drive or rotor shaft 26 rotatably extends inwardly through the frame 12 and is supported therein by a main bearing 28. The plate 30 is welded to the inner end of shaft 26 for rotation therewith and includes a plurality of openings 32 formed therein for receiving bolts 34 which are adapted to be threadably received by one end of the rotor 35.

Figure 6:
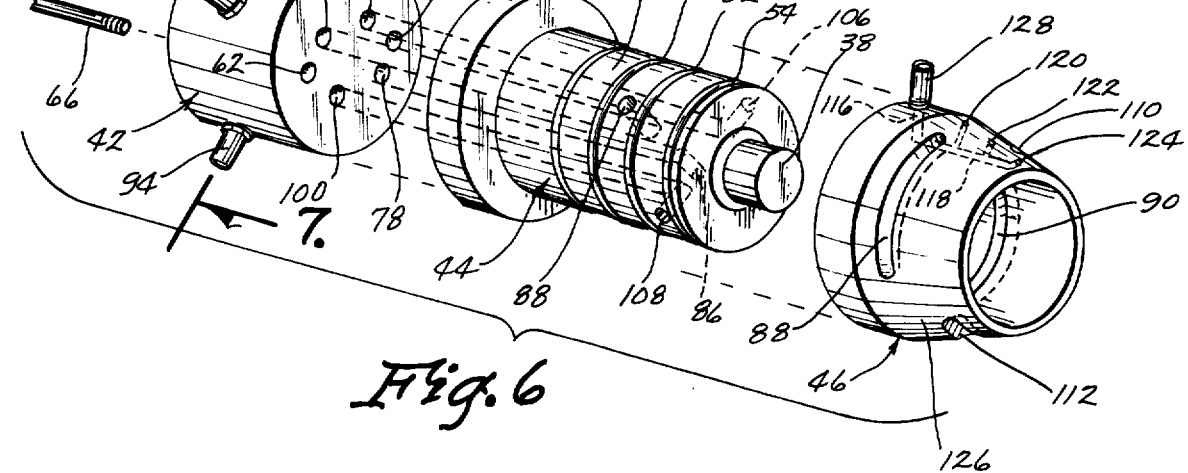
FIG. 6 is an exploded perspective view of the core.

The numeral 36 refers generally to a core which extends through frame 14 into engine 10 so that its inner end 38 is journaled in bearing 40. Core 36 is comprised of core members 42, 44 and 46. As seen in FIGS. 5 and 6, core member 46 is mounted upon the reduced diameter portion 48 of core member 44. The reduced diameter portion 48 is provided with three spaced apart annular grooves 50, 52, and 54 which have sealing O-rings 56, 58 and 60 mounted therein respectively as illustrated in FIG. 9.

Core member 42 is provided with a pair of spaced apart bores 62 and 64 formed therein which are adapted to receive bolts 66 and 68 respectively. The core member 44 is also provided with a pair of threaded bolt openings formed therein which are adapted to threadably receive the inner ends of the bolts 66 and 68 to secure the core members 42 and 44 together. Core member 42 is also provided with an internally threaded port 70 having an air fitting or conduit 72 mounted therein. Port 70 communicates with a bore 74 extending inwardly therefrom which communicates with a pair of passageways 76 and 78 which extend therefrom. As seen in FIG. 9, core member 44 is provided with a pair of longitudinally extending passageways 80 and 82 which communicate with the passageways 76 and 78. The inner ends of the passageways 80 and 82 terminate in radially extending passageways 84 and 86 respectively which communicate with elongated arcuate grooves 88 and 90 formed in core member 46. As seen in FIG. 9, the passageway portions 84 and 86 are positioned between the O-rings 56 and 58 and are positioned 180° apart.

Core member 42 is also provided with an internally threaded port 92 having a fuel or mix fitting or conduit 94 threadably mounted therein. Port 92 communicates with a passageway 96 formed in core member 42 which communicates with a pair of longitudinally extending passageways 98 and 100 as illustrated in FIG. 8. Core member 44 is provided with a pair of longitudinally extending passgeways 102 and 104 formed therein which communicate with the inner ends of the passageways 98 and 100 (FIG. 8). The inner ends of passageways 102 and 104 terminate in radially extending passageway portions 106 and 108 which communicate with the elongated arcuate grooves 110 and 112 respectively which are formed in core member 46.

Core member 46 is provided with a threaded port 114 which communicates with the passageway 116 extending inwardly therefrom as illustrated in FIG. 8. The inner end of passageway 116 communicates with the longitudinally extending bore or passageway 118 which has three bores or passageways 120, 122 and 124 extending diagonally outwardly therefrom to the tapered portion 126 of core member 46. An oil fitting or conduit 128 is threadably mounted in the port 114 and is in communication with a source of oil under pressure.

The numeral 130 refers to a rotary valve having an internally beveled outer end portion 132 which is rotatably mounted on the tapered surface 126 of core member 46 (FIG. 5). As seen in FIG. 5, valve 130 is rotatably mounted on the bearing 40. The valve 130 is secured to rotor 35 by any convenient means for rotation therewith. The valve 130 is provided with four radially spaced air passageways 134 extending therethrough and four radially spaced fuel or mix passageways 136 extending therethrough as will be described in more detail hereinafter.

A plurality of cylinders 138 are secured to the rotor 35 by means of the bolts 140 extending through the openings 142 formed in the flange 144 and being received by the rotor 35 as illustrated in FIG. 2. Each of the cylinders 138 generally comprises inner end portion 146 and a skirt portion 148. Skirt portion 148 is provided with opposing slots 150 and 152 formed therein. Each of the cylinders 138 is provided with a plurality of radially spaced air openings 154 formed therein and a plurality of radially spaced mix openings 156 formed therein as illustrated in FIG. 3. As shown in FIG. 3, the cylinder 138 is also provided with a plurality of radially spaced exhaust openings 158. The exhaust openings 158 are approximately ⅛ inch closer to the inner end of the cylinder than are the air and mix openings 154 and 156 for a purpose to be described in more detail hereinafter.

A piston 160 is slidably mounted in each of the cylinders 138 and generally comprises a head portion 162 and a skirt portion 164. A roller 166 is mounted on shaft 168 which is secured to skirt portion 164. Roller 166 rolls upon the cam surface 170 of the cam plate 18 to cause the piston to move with respect to the cylinder as the rotor of the engines rotates. Each of the pistons 160 is provided with piston rings 172, 174 and 176. As seen in FIG. 5, piston ring 172 is adapted to seal the small combustion reservoir cavities 178 which are formed in the inner surface of the cylinders 138. The cavities 178 are radially spaced apart and extend completely around of the top of the cylinder as shown in the drawings. The cavities 178 are positioned so that the piston ring 172 seals the cavities 178 slightly before the piston reaches top center. As the piston reaches top center and starts to descend on the exhaust stroke, the cavities 178 are exposed to the combustion chamber of the cylinder as will be described in more detail hereinafter.

As illustrated in FIG. 5, the exhaust openings 158 formed in the cylinders 138 communicate with exhaust passageways 180 formed in rotor 35 which communicate with chamber 182 in rotor 35 which communicates with the bore 184 extending through shaft 26 to provide a means for exhaustingg the combustion gases from the motor.

Cam surface 170 of cam plate 18 includes oppositely disposed lobes 186 and 188. For purposes of description, the cam surfaces closely adjacent the opposite sides of lobe 186 will be indicated by the reference numerals 190 and 192 respectively. The cam surfaces closely adjacent the opposite sides of lobe 188 will be indicated by the reference numerals 194 and 196 respectively. The cam surface approximately midway between 192 and 194 will be referred to by the reference numeral 198 while the cam surface approximately midway between 196 and 190 will be referred to by the reference numeral 200.

In operation, fuel or mix under pressure is constantly supplied to the conduit 94 so that mix under pressure is constantly supplied to the arcuate fuel grooves 110 and 112. The only time that mix will pass outwardly from the grooves 110 and 112 is when the grooves communicate with the passageways 136 formed in rotary valve 130. The passageways 136 communicate with the openings 156 in the cylinders 138 so that mix under pressure will be supplied to the interior of the cylinders when the passageways 136 do register with the grooves 110 or 112.

Air under pressure is constantly supplied to the air conduit 72 so that air under pressure is constantly supplied to the arcuate grooves 88 and 90 formed in core member 46. The only time that air will be discharged from the grooves 88 and 90 is when the grooves 88 and 90 communicate or register with the passageways 134 formed in rotary valve 130. The air passageways 134 communicate with the air openings 154 formed in the cylinders 138.

Oil under pressure is supplied to the conduit 128 so that lubricating oil will be introduced between the tapered portion 126 of core member 46 and the beveled portion of the rotary valve 130 by means of the openings 120, 122 and 124.

FIG. 2 illustrates the top and bottom pistons at top center. In the position of FIG. 2, the rollers on the pistons are on the top center of the lobes 186 and 188 respectively. Inasmuch as the operation of the top piston is identical to the operation of the bottom piston (FIG. 2), only the operation or cycle of the top piston will be described.

In operation, the cylinder is charged with a mixture of mix and air as previously described when the piston is in its extreme expanded position. As the piston moves up the cylinder, the mix and air are compressed and the compressed mix and air mixture is present in the cavities 178. As the piston nears the end of its compression stroke, while the ring of reservoir cavities 178 are still exposed, the pressure of the fuel mixture approaches but does not quite reach ignition pressure. The piston 160 moves past the openings or cavities 178 which closes the cavities which are filled with a part of the combustible mixture. The balance of the combustible charge is confined in the comparatively small clearance above the head of the piston and the inner end of the cylinder. With only a slight additional movement of the piston, the remaining fuel charge is rapidly compressed to a very high pressure which is well beyond ignition pressure to ignite the small charge in the clearance above the piston. As the piston expands and moves below the reservoir cavities 178, the reservoir fuel in the cavities 178 is ignited. Inasmuch as the relationship between the displacement of the piston and the small combustion chamber remaining after the reservoir volume is substracted from the combustion chamber, the rate of compression increases very rapidly with only a slight movement of the piston. For this reason, even the pressure required to cause ignition may vary considerably due to atmospheric or engine conditions, the piston will not move very far to attain the complete range of ignition pressures. By varying the volume of the reservoir cavities compared to the combustion chamber above the reservoir, it is possible to very accurately time the position of ignition with respect to top center. The reservoir cavities 178 are extremely important and provide a unique means of controlling the timing of a compression ignition engine which could be used not only in a rotary engine but would be advantageous in a conventional diesel engine. The advantages of the reservoir cavities are in the simplicity of feeding the fuel in with the air at approximately atmospheric pressures instead of injecting the fuel and air into the cylinder against extremely high compression pressures where the metering of fuel becomes very critical. The second advantage is in the problems of pollution since fuel injected as liquid fuel, as in a conventional diesel, cannot be burned as thoroughly as possible when the fuel is mixed with air and allowed to volatize ahead of ignition.

As previously stated, the exhaust opening 158 in the cylinders 138 are approximately ⅛ inch closer to the inner end of the cylinder than are the air and mix openings 154 and 156. The positioning of the exhaust openings 158 is for timing purposes so that on the expansion stroke the piston will expose the exhaust openings 158 first to bleed the exhaust gas pressure from the cylinder. Soon after the exhaust openings 158 are exposed to the combustion chamber as the piston moves downwardly in the cylinder, the air scavenging openings 154 and fuel charging openings 156 become exposed to the interior of the cylinder. The scavenging and cooling air is channeled to the openings 154 which aids in scavenging the exhaust gases from the cylinder when the top of the piston has moved below the openings 154 so that ambient air from the air blower is being forced through the cylinder and out the exhaust openings 158 and outwardly through the drive shaft 26 as previously described. The air not only scavenges the exhaust from the cylinder but aids in cooling the engine as well as recharging the cylinder for the next cycle. The volume of air passing outwardly through the openings 158 is not nearly as much as needed to cool a cylinder from its outside surface. The temperature of the inside surface of the cylinder is far higher than the temperature of the outside surface of the cylinder and therefore the heat transfer rate between inside cylinder surface and the air is much faster than would be possible when cooling the cylinder from the outside. Therefore, it has been found that a lesser amount of air on the inside of the surface is quite adequate because of the greater temperature difference and its faster cooling rate. Furthermore, since the pistons are controlled by the shape of a cam, it is a simple matter to allow the compression stroke, and especially the expansion stroke to be condensed into a smaller portion of a revolution so that less heat is lost into the walls of the cylinder therefore requiring less cooling. Further, as the compression and expansion time is shortened, more time is allowed in the cycle for the cooling.

The forcing of the air into the cylinders also achieves an additional result. In conventional rotary engines, centrifugal force is employed to maintain the pistons out against the cam. Centrifugal force alone is not enough to overcome the vacuum effect when the pistons are required to suck in their charge of air in the conventional manner. In this engine, the blower or air pump is used to charge the cylinders which forces the air into the cylinders under pressure so that rather than a vacuum which retards the outward movement of the pistons, a pressure is provided which aids the centrifugal force in moving the pistons out against the cam. The air pressure against the piston insures that the rollers on the pistons will follow the cam as well as providing a supercharging effect.

Thus it can be seen that the rotary internal combustion engine of this invention provides a means for efficiently timing ignition of the same through the use of a plurality of radially spaced combustion reservoir cavities formed in the interior of the cylinder. It can also be seen that a novel means has been provided for charging the cylinders with the mixture of fuel and air together with a means for purging the exhaust gases therefrom. The rotary valve employed in this engine eliminates the sealing problems which have plagued the rotary internal combustion engine field.

Thus it can be seen that the invention accomplishes at least all of its stated objectives.

I claim:

1. A rotary internal combustion engine comprising,
   an engine frame means including a rotatable power output means,
   a rotor means in said frame means connected to said power output means,
   a plurality of cylinders mounted on said rotor means,
   a piston movably mounted in each of said cylinders and being movable between compression and expansion positions with respect thereto,
   a cam plate means on said frame means extending around said rotor means and having a cam surface,
   means mounted on each of said pistons which engages said cam surface to cause said piston to be moved in said cylinder as said rotor means is rotated with respect to said cam plate,
   a rotary valve means secured to said rotor means for rotation therewith,
   an air passageway means for supplying air to said rotary valve means,
   a fuel supply passageway means for supplying fuel to said rotary valve means,
   means for supplying air and fuel, respectively, to said air passageway means and said fuel passageway means,
   each of said cylinders having air openings formed therein and extending therethrough,
   each of said cylinders having fuel openings formed therein and extending therethrough,
   said rotary valve means having an air passageway means provided therein for supplying air to said air openings in said cylinders,
   said rotary valve means having a fuel passageway means provided therein for supplying fuel to said fuel openings in said cylinders.

2. The engine of claim 1 wherein said rotary valve means is positioned adjacent one side of said cylinders, said fuel and air openings being formed in said cylinders at one side thereof.

3. A rotary internal combustion engine comprising,
   an engine frame means including a rotatable power output means,
   a rotor means in said frame means connected to said power output means, said rotor means having a central opening,
   a plurality of cylinders mounted on said rotor means,
   a piston movably mounted in each of said cylinders and being movable between compression and expansion positions with respect thereto,
   a cam plate means on said frame means extending around said rotor means and having a cam surface,
   means mounted on each of said pistons which engages said cam surface to cause said piston to be moved in said cylinder as said rotor means is rotated with respect to said cam plate,
   a core means extendingg into said engine frame means opposite to said rotatable power output means, said core means having an inner end,
   a rotary valve means rotatably mounted on the inner end of said core means, said rotary valve means being secured to said rotor means for rotation therewith,
   said core means having an air passageway means extending therethrough for supplying air to said rotary valve means,
   said core means having a fuel supply passageway means extending therethrough for supplying fuel to said rotary valve means,
   each of said cylinders having a plurality of spaced apart air openings formed therein and extending therethrough,
   each of said cylinders having a plurality of spaced apart fuel openings formed therein and extending therethrough,
   said rotary valve means having an air passageway means provided therein for supplying air from said core means to said air openings in said cylinders,
   said rotary valve means having a fuel passageway means provided therein for supplying fuel from said core means to said fuel openings in said cylinders.

4. The engine of claim 3 wherein said core means has a tapered inner end portion, said rotary valve means having an internally beveled outer end portion which rotatably embraces the tapered inner end portion of said core means.

5. The engine of claim 4 wherein said core means has a lubrication oil passageway means formed therein for lubricating said tapered inner end portion.

* * * * *